US011553627B1

(12) United States Patent
Gregory et al.

(10) Patent No.: US 11,553,627 B1
(45) Date of Patent: Jan. 10, 2023

(54) COMPONENT EJECTION FOR FLUID LEAK ISOLATION

(71) Applicant: Amazon Technologies, Inc., Seattle, WA (US)

(72) Inventors: Luke Thomas Gregory, Mercer Island, WA (US); Ryan F. Conroy, Seattle, WA (US); Felipe Enrique Ortega Gutierrez, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 961 days.

(21) Appl. No.: 16/363,264

(22) Filed: Mar. 25, 2019

(51) Int. Cl.
*H05K 7/20* (2006.01)
*G05B 19/406* (2006.01)
*H02H 7/20* (2006.01)
*H05K 7/14* (2006.01)

(52) U.S. Cl.
CPC ....... *H05K 7/20781* (2013.01); *G05B 19/406* (2013.01); *G05B 2219/50324* (2013.01); *H02H 7/20* (2013.01); *H05K 7/1492* (2013.01)

(58) Field of Classification Search
CPC .................................................. H05K 7/20781
See application file for complete search history.

(56) References Cited

U.S. PATENT DOCUMENTS 10,010,013 B2 * 6/2018 Shelnutt ............. H05K 7/20781
2020/0232572 A1 * 7/2020 Lyon ..................... F16K 37/005

* cited by examiner

*Primary Examiner* — Mukundbhai G Patel
(74) *Attorney, Agent, or Firm* — Kilpatrick Townsend & Stockton LLP (57) ABSTRACT

A sensor may detect a coolant leak at or near an appliance that is slidable between a seated position and an ejected position relative to a rack. In the seated position, a coolant supply line may be coupled with a conduit of the appliance to convey coolant past the appliance. A biaser can bias the appliance toward the ejected position, and a latch may secure the appliance in a seated position against the biaser. A releaser can release the latch in response to coolant leak detection by the sensor and permit the biaser to move the appliance toward the ejected position, for example, which may cause the conduit to become disconnected from the coolant supply line to cut off flow to the leak.

20 Claims, 5 Drawing Sheets

COMPONENT EJECTION FOR FLUID LEAK ISOLATION

BACKGROUND

Datacenters contain large amounts of computing equipment, which can include servers and networking hardware such as switches and routers. One important consideration for datacenters is how to effectively cool computing equipment components to reduce risks of equipment failure that may make computing resources unavailable. Liquid-cooled systems can be used, but such systems introduce a risk of coolant leaks, such as at an individual-component level. Such individual failure may also damage or impart other negative effects to other nearby or otherwise associated components.

BRIEF DESCRIPTION OF THE DRAWINGS

Various embodiments in accordance with the present disclosure will be described with reference to the drawings, in which.

DETAILED DESCRIPTION

Technologies described herein relate to automatic ejection of a chassis from a rack, such as in response to detection of a leak in coolant delivery components of a cooling system, which leak may negatively impact computing resources if unchecked. For example, an individual chassis may include a server or other computing equipment component that is supplied with coolant by a conduit through the chassis. The conduit may be connected via a connector to a fluid supply line that may also supply components in one or more other chassis received within a given rack. Sensors may be positioned to facilitate detection of individual leaks that occur in any particular chassis. Responsive to sensor data indicating that a leak is present in a particular chassis, the affected chassis may be automatically ejected while one or more other chassis that are not affected by the leak may be retained in position in the rack so as to not disrupt availability of computing resources apart from those affected by the leak.

The connector that provides the interface between the conduit of the chassis and the supply line of the rack may be, for example, an anti-leak and/or quick-disconnect connector, such that ejection of the chassis with the leak stops any further flow from the supply line to the conduit. Stopping the flow may stop or prevent any further leaking that might otherwise negatively affect components in the chassis with the leak, in one or more surrounding chassis, or in other parts positioned below the chassis with the leak. In this manner, the chassis with a detected leak can be automatically isolated to prevent damage to other components and/or to stop a flow that would perpetuate the leak and potentially increase an amount of damage that may be experienced due to the leak.

Ejection of the chassis may be accomplished by force provided by a biaser. In some embodiments, the biaser may be incorporated into the connector. For example, the connector may be spring-loaded or otherwise include a structure that initially provides a resistance to engagement of the connector on the chassis with a mating connector of the fluid supply line, where the resistance is overcome by force to achieve engagement of the connector when inserting the chassis into the rack. The structure that provides the resistance may function as the biaser to eject the chassis in response to the chassis being unlatched or otherwise released. In some embodiments, structure of the connector may be supplemented or replaced with a spring or other biaser that is both distinct from the connector and capable of providing some or all of the force to eject the chassis.

A latch may be provided that secures the chassis in a seated position until the latch is released to allow the biaser to push the chassis from a seated position to an ejected position. A suitable actuator or other releaser may be provided to disengage the latch automatically in response to detection of a leak based on sensor input. Disengaging the latch may allow the chassis to be released and automatically ejected under force provided by the biaser.

In some embodiments, other actions may be taken in addition to or as alternatives to ejecting the chassis. For example, if a leak is detected, computing equipment components may be prompted to backup, offload, migrate, or otherwise transfer data and/or computing processes, shutdown, or take other mitigation actions, e.g., which may be performed before ejection that may also disconnect data and/or power supply to components to the chassis.

In the description herein, various embodiments are described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
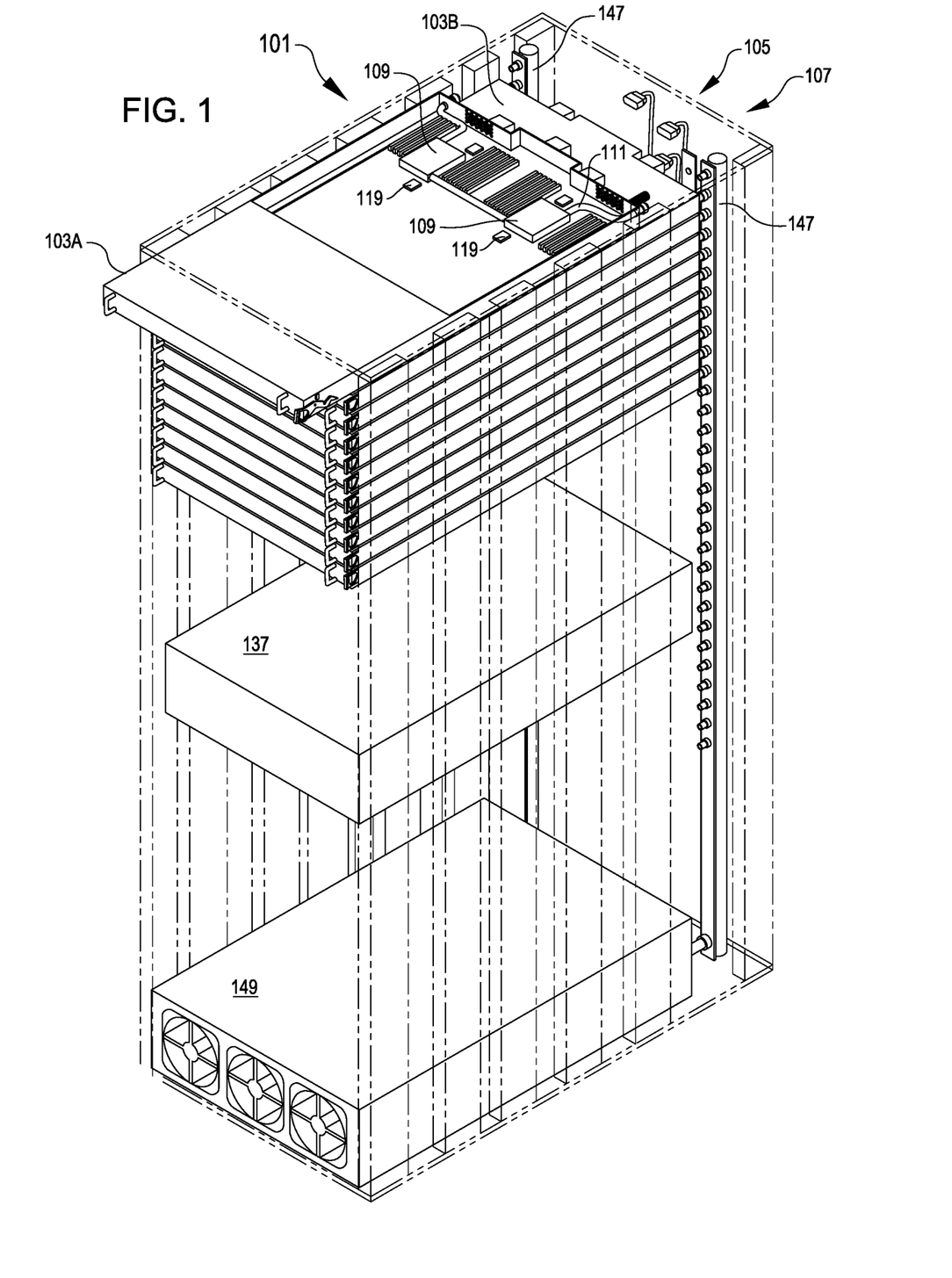
FIG. 1 is a perspective view of a rack that may be used within a datacenter according to certain embodiments.

FIG. 1 depicts a rack 101 and associated components according to certain embodiments. The rack can support any number of chassis 103. For example, although ten chassis 103 are shown in FIG. 1, any other number could be used, including a single chassis 103, between one and nine, or ten or more. For ease of reference, suffixes will be used to distinguish among different instances (which may be identical or different), for example, a first chassis 103A and a second chassis 103B denoted in FIG. 1. For example, the first chassis 103A is shown in an ejected position while the second chassis 103B is shown in a seated position.

Suitable components of an ejection system 105 may be included, e.g., to facilitate movement between the ejected and seated positions. Some examples of components that may be suitable for the ejection system 105 are described below in greater detail with respect to FIG. 2. Suitable components of a cooling system 107 can also be included. The cooling system 107 may provide coolant or otherwise provide cooling to components in the chassis 103 within the rack. Some examples of components that may be suitable for the cooling system 107 are also described below in greater detail with respect to FIG. 2. Components of the ejection system 105 and/or cooling system 107 may be located in the rack 101, in a chassis 103, or remote and/or separate from both the rack 101 and chassis 103.

Figure 2:
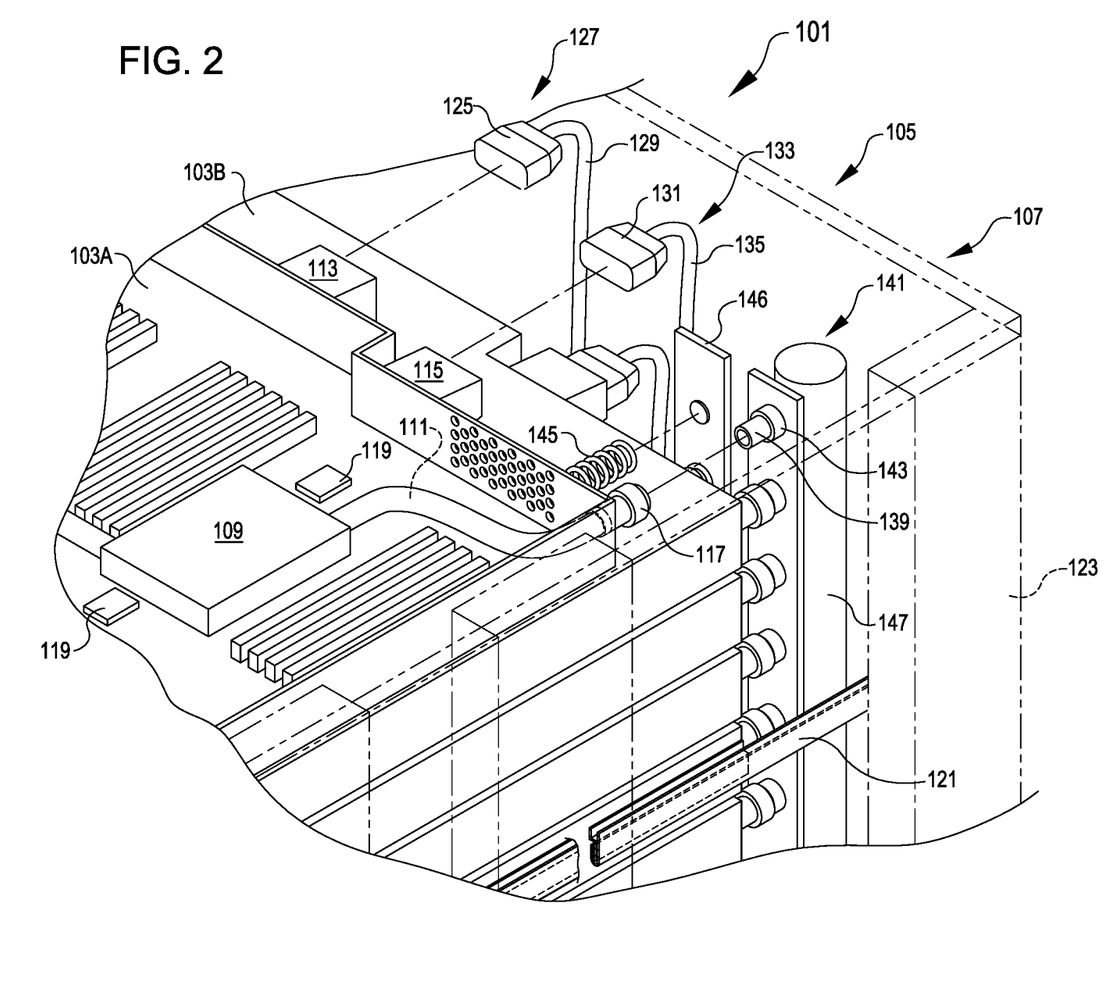
FIG. 2 illustrates an enlarged view of an upper and lateral portion of a rear of the rack of FIG. 1 according to certain embodiments.

FIG. 2 shows an enlarged view of a rear corner of the rack 101. In FIG. 2, the first chassis 103A is shown with various components that may be also present in other chassis 103 such as the second chassis 103B. The chassis 103A is depicted in FIG. 2 with an appliance 109, a coolant conduit 111, a power connector 113, a data connector 115, a coolant connector 117, and a sensor 119.

Various elements of the chassis 103 may facilitate connection of the chassis 103 when the chassis 103 is fully received within the rack 101. For example, in various embodiments, blind mate connectors may be utilized. Blind mate connectors allow connection to be established by the act of receiving the chassis 103 or installing the chassis 103 within the rack 101. Any of the power connector 113, the data connector 115, and/or the coolant connector 117 may utilize blind mate connectors. However, in some embodiments, some components may be arranged to be manually connected following installation of the chassis 103 in lieu of or in addition to using blind mate connectors to automatically connect to the chassis 103 upon installation. In various embodiments, installing the chassis 103 within the rack 101 can involve sliding the chassis 103 along a set of one or more rails 121 that are supported by vertical struts 123 of the rack 101. However, other suitable structures may be utilized for facilitating sliding or other movement of the chassis 103 relative to the rack 101 including, but not limited to, bearing elements that may include polished surfaces and/or ball bearings or any other structures suitable for facilitating sliding.

The power connector 113 can correspond to any structure for establishing a power connection. In FIG. 2, the power connector 113 and a mating power connector 125 are each depicted as functional blocks that can engage each other, but may correspond to any suitable structure, including, but not limited to, a plug with a set of prongs and a corresponding socket for receiving the prongs. The power connector 113 and the mating power connector 125 can correspond to portions of a power connection interface 127. Any suitable type of power connection interface 127 additionally or alternatively can be used, however, including, but not limited to, arrangements in which the power connector 113 of the chassis 103 is instead socket-like and the mating power connector 125 is plug-like. The power connector 113 can be coupled with any appropriate wires, traces, or other structures for conveying power from the power connector 113 to the appliance 109, sensor 119, and/or other components of the chassis 103.

In FIG. 2, the mating power connector 125 is depicted as joined to a power cable 129, which may provide a power conduit to or from other components. For example, the power cable 129 may lead to or be replaced with a power supply unit positioned on a rear side of the rack 101 in a direct alignment with the power connector 113. However, other arrangements are also possible, including an arrangement with a power supply unit positioned elsewhere on the rack 101 and coupled to the power connector 113 via the power cable 129, such as may be supported by a power harness structure.

The data connector 115 can correspond to any structure capable of establishing a connection for communicating data from, to, or relative to the chassis 103 or components therein. The data connector 115 may be coupled with a mating data connector 131. The data connector 115 of the chassis 103 and the mating data connector 131 and may together form parts of a data connection interface 133. Suitable examples of types of the data connection interface 133 may include pluggable optical transceivers (such as small form-factor pluggable (SFP), enhanced small form-factor pluggable (SFP+), compact small form-factor pluggable (CSFP), or other variations such as QSFP, QSFP+, QSFP28, QSFP56, QSFP56-DD, or OSFP), interconnect interfaces (such as Ultra path Interconnect (UPI), peripheral component interconnect express (PCIE), an RJ45 connector type or a similar connector type, or a connector sized and arranged to meet any other suitable standards that may be known in the art.

The mating data connector 131 can be coupled with a data cable 135 that may convey data to or from one or more other chassis 103 or other elements in the rack 101, such as the network switch 137 (FIG. 1) that may also be present in the rack 101. The data cable 135 additionally or alternatively may connect and convey data to or from components that are remote from the rack 101. Moreover, although the data cable 135 is shown in FIG. 2 as an independent cable without other support structure, the data cable 135 or mating data connector 131 may be supported by a data cable harness or other supporting structure, e.g., to maintain the data cable 135 and/or mating data connector 131 in alignment for engagement with the chassis 103.

The coolant connector 117 can correspond to any suitable structure for establishing a connection through which coolant can be conveyed. The coolant connector 117 may be arranged to engage a mating coolant connector 139. The coolant connector 117 on the chassis 103 and the mating coolant connector 139 can together form parts of a coolant connection interface 141. The coolant connection interface 141 may correspond to an anti-leak connection interface. For example, the structures of the coolant connection interface may be arranged to cut off coolant supply when the coolant connector 117 of the chassis 103 is disconnected from the mating coolant connector 139. Suitable examples may include quick-disconnect or quick-release couplings or fittings that may be commercially available.

In some aspects, the coolant connection interface 141 (or some part thereof) can include a first biaser 143. The first biaser 143 is depicted in FIG. 2 as a compressible ring, although the first biaser 143 may correspond to a spring or any structure that can provide a biasing force to resist connection of the coolant connector 117 and the mating coolant connector 139 or predispose those parts towards separating from one another in the absence of a force to maintain them together. Moreover, although the first biaser 143 is depicted as an external component in FIG. 2, the first biaser may alternatively or additionally include a component internal to either the coolant connector 117 or the mating coolant connector 139.

A second biaser 145 can additionally or alternatively be included. The second biaser can be separate from the coolant connection interface 141. In FIG. 2, the second biaser is shown as a coil spring, e.g., that can provide a biasing force in response to compression from the chassis 103 being inserted into the rack 101. For example, the second biaser 145 may push against a support structure 146 to store energy for later use. The support structure 146 is shown as a separately added bar at the rear of the rack, but may correspond to an extension flange of the coolant supply line 147 or any other suitable surface or feature that can engage or preload the second biaser 145. Although the second biaser 145 is depicted as adjacent to the coolant connection interface 141, in some examples, the second biaser 145 may be otherwise positioned, including, but not limited to at least partially surrounding the coolant connection interface 141 (such as if placed over either or both of the coolant connector 117 and the mating coolant connector 139). Moreover, the second biaser 145 may be mounted to any suitable structure (e.g., mounted to the chassis 103 to travel with the chassis 103, mounted to the rack 101 to remain in place regardless of travel of the chassis 103, or mounted to both the chassis 103 and rack 101). According to varying embodiments, the first biaser 143 and the second biaser 145 may be used alone or in conjunction with one another or other biasers and/or included in the ejection system 105.

A biasing force (e.g., from the first biaser 143 and/or the second biaser 145) can be utilized to provide a sufficient force to automatically eject the chassis 103. For example, if the chassis 103 is secured, latched, or otherwise engaged in the rack 101, the first biaser 143 and/or the second biaser 145 may provide a force to move the chassis 103 when the chassis is subsequently released to allow movement.

The cooling system 107 can include a coolant supply line 147. The coolant supply line 147 may be connected to a coolant module 149 (FIG. 1), for example, to provide coolant to multiple chassis 103 within the rack 101. The coolant module 149 may include suitable heat exchangers, pumps, or other structures for circulating coolant relative to components in a chassis 103 or multiple chassis 103. As an illustrative example in FIG. 1, coolant may flow up through a coolant supply line 147 depicted at the right side of the rack 101 in FIG. 1, through a coolant conduit 111 and multiple appliances 109 in the chassis 103A, and then out and down a second coolant supply line 147 depicted at the left side of the rack 101 in FIG. 1. Other arrangements are also possible, for example, including an arrangement in which coolant is circulated through only one appliance 109 or through more than two appliances 109. As another example, coolant may flow in one coolant connection interface 141 and out through another coolant connection interface on the same side of the chassis 103, for example, if a coolant supply line 147 includes multiple passages in it for circulating coolant.

As previously described, a sensor 119 can be provided for detecting a leak in the cooling system 107. For example, referring again to FIG. 2, the sensor 119 may be positioned adjacent the appliance 109 or other suitable location within the chassis 103 for detecting a leak from the cooling system 107. The sensor 119 may additionally or alternatively include some component on the rack 101 or other location remote from the chassis 103 and/or appliance 109. The sensor 119 can be any device, mechanical or electrical, that can sense a leak. Suitable examples may include a moisture sensor, an optical sensor, an infrared sensor, and/or a pressure sensor. For example, an optical sensor, infrared sensor, or other type of sensor may be capable of detecting bubbles or other detectable characteristic in a coolant loop that may correspond to a change between an upstream point and a downstream point in a manner that may indicate introduction of air, fluid loss, flow change, or other evidence of a leak. As another example, a pressure sensor may provide information about pressure changes that may indicate presence of a leak. In some examples, a moisture sensor may be utilized to detect if leaked coolant has reached the location of the moisture sensor. Input from the sensor 119 may be utilized to trigger ejection of the chassis 103, for example. Placement of the sensor 119 adjacent to and/or otherwise within range of the coolant conduit 111 and/or the appliance 109 may allow a leak to be detected before reaching the appliance 109 or other sensitive component within the chassis 103. The appliance 109 may correspond to a computer server, or any other computing equipment component.

Figure 3:
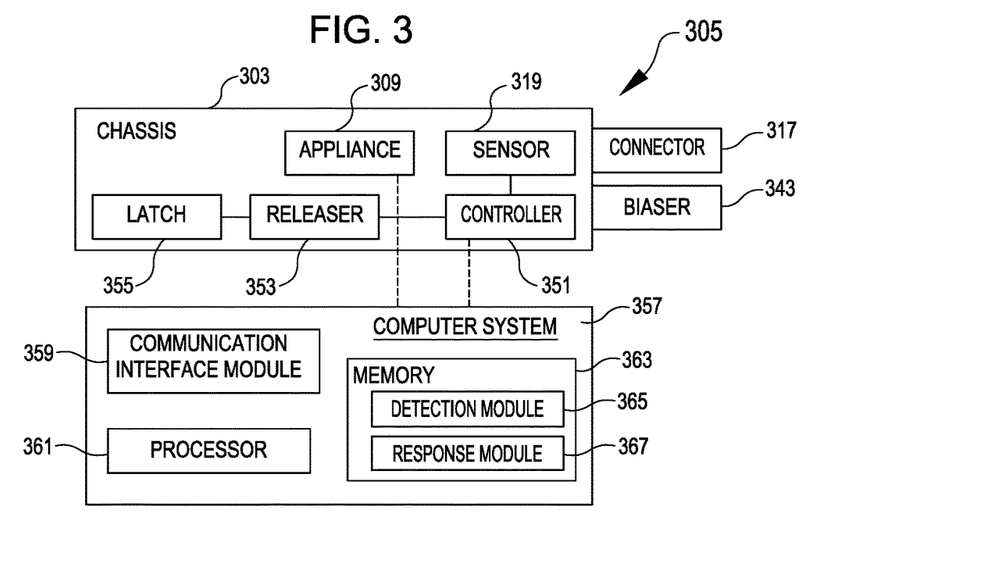
FIG. 3 is a block diagram illustrating components of an ejection system according to certain embodiments.

FIG. 3 is a block diagram showing various components of an ejection system 305, e.g., which may provide the functions and/or structure of the ejection system 105, described above. The ejection system 305 in FIG. 3 includes a chassis 303, an appliance 309, a connector 317, a sensor 319, a biaser 343, a releaser 353, and a latch 355.

Other elements in FIG. 3 may be examples of similar elements in other figures discussed earlier herein. For example, the chassis 303 may be an example of the chassis 103; the appliance 309 may be an example of the appliance 109; the sensor 319 may be an example of the sensor 119; the connector 317 may be an example of the power connector 113, the data connector 115, and/or the coolant connector 117; and the biaser 343 may be an example of the first biaser 143 and/or the second biaser 145.

The chassis 303 can correspond to a tray, sled, or any other structure for supporting items and/or facilitating movement in and/or out of the rack 101. The appliance 309 can correspond to a server, switch, router, or any other computing equipment component that may be interconnected with other elements.

The connector 317 may correspond to any suitable structure for connecting the chassis 303 when full installed, such as in the rack 101. For example, the connector 317 may include or correspond to the power connector 113, the data connector 115, and/or the coolant connector 117.

The biaser 343 can include any structure capable of providing a biasing force for ejecting the chassis 303. For example, the biaser 343 can include or correspond to the first biaser 143 and/or the second biaser 145.

The latch 355 may include any structure capable of retaining the chassis 303 in a seated position, configuration, or state. An example of a latch 355 is described in FIG. 4, although other suitable structures may be additionally or alternatively utilized, including but not limited to elements that may include cam surfaces, ramp surfaces, or other engaging surfaces or features such as notches, etc.

The releaser 353 may correspond to any suitable form of actuator for releasing the latch 355 and permitting movement of the chassis 303. Examples of the releaser 353 may include a solenoid, electromagnet, linear actuator, motor, or any other form of actuator for moving and/or releasing the latch 355. The releaser 353 may correspond to a releaser actuator.

The sensor 319 may provide input that triggers operation of the releaser 353 or other response. In some embodiments, the sensor 319 can be in communication with a controller 351. The controller 351 may correspond to a separate element from the appliance 309 and/or may include or be included by the appliance 309. The appliance 309 and/or the controller 351 may be examples of computer systems such as the computer system 357 in FIG. 3. In general, for example, as described further below, the computer system 357 may function as a controller that controls other components of the ejection system 305, and/or other components of the ejection system 305 may function as appropriate inputs and/or outputs for control of the ejection system 305 by the computer system 357.

The illustrated computer system 357 includes a communication interface module 359, a processor 361, a memory 363, a detection module 365, and a response module 367. The computer system 357 may represent a single component, multiple components located at a central location within the ejection system 305, or multiple components distributed throughout the ejection system 305. In general, the computer system 357 may include any appropriate combination of hardware and/or software suitable to provide the described functionality.

The processor 361 is operable to execute instructions associated with the functionality provided by computer system 357. The processor 361 may comprise one or more general purpose computers, dedicated microprocessors, or other processing devices capable of communicating electronic information. Suitable examples of the processor 361 may include one or more application-specific integrated circuits (ASICs), field programmable gate arrays (FPGAs), digital signal processors (DSPs) and any other suitable specific or general purpose processors.

The memory 363 stores processor instructions, state information for the various components of ejection system 305, and/or any other appropriate values, parameters, or information utilized by the computer system 357 during operation. The memory 363 may represent any collection and arrangement of volatile or nonvolatile, local or remote devices suitable for storing data. Suitable examples of the memory 363 may include, but are not limited to, random access memory (RAM) devices, read only memory (ROM) devices, magnetic storage devices, optical storage devices or any other suitable data storage devices.

The communication interface module 359 can communicate with any of the components within or related to the chassis 303. The communication interface module 359 may facilitate communication between the computer system 357 and other components of ejection system 305, including information and/or instructions conveyed between any of the chassis 303, appliance 309, connector 317, sensor 319, biaser 343, releaser 353, latch 355, and/or controller 351. These communications may represent communication of any form appropriate based on the capabilities of the computer system 357 and may include any suitable information. Depending on the configuration of the computer system 357, the communication interface module 359 may be responsible for facilitating either or both of wired and wireless communication between the computer system 357 and the various components of ejection system 305. In particular embodiments, the computer system 357 may communicate using communication protocols such as Ethernet, 802.11, Bluetooth, or Infrared Data Association (IrDA) standards. In some embodiments, the communications interface module 359 may interact with a network, which may provide communication between the computer system 357 and other components, such as other computer systems (e.g., the appliance 309 and/or controller 351 when separate from the computer system 357) or sources of data or input (e.g., historical or predictive information about relevant parameters such as flow or temperature of coolant being provided or other relevant conditions).

In general, the detection module 365, the response module 367, and the communication interface module 359 may each represent any appropriate hardware and/or software suitable to provide the described functionality. In addition, as noted above, the computer system 357 may, in particular embodiments, represent multiple different discrete components and any or all of the detection module 365, the response module 367, and the communication interface module 359 may represent components physically separate from the remaining elements of computer system 357. Moreover, any two or more of the detection module 365, the response module 367, and the communication interface module 359 may share common components. For example, in particular embodiments, the detection module 365 and the response module 367 represent computer processes executing on the processor 361 and the communication interface module 359 comprises a wireless transmitter, a wireless receiver, and a related computer process executing on the processor 361.

The detection module 365 may determine conditions present in the ejection system 305. The detection module 365 may obtain information from the sensor 319, for example. The information from the sensor 319 may permit the detection module 365 to determine that a leak is present in the chassis 303. The sensor, for example, may include a moisture sensor or other suitable sensor.

The response module 367 can generate a suitable response, for example, based on a determination that a leak is present or some other information from the detection module 365. For example, the response module 367 may prompt a response in which the releaser 353 interacts with the latch 355 to release the chassis 303 so that the biaser 343 can cause the chassis 303 to move out of a seated position. Moving the chassis 303 out of the seated position may cause the connector 317 to disengage. For example, this may correspond to the power connector 113, the data connector 115, and/or the coolant connector 117 disengaging from the corresponding structure of the rack 101.

As another example, the response module 367 may instruct the appliance 309 to offload or otherwise transfer data, shutdown, or perform some other mitigation action. In some aspects, the response module 367 may prompt a response that has a time delay incorporated before ejection of the chassis 303. For example, such a time delay may be beneficial to allow completion of transfer of data and/or other protective measures before the chassis 303 is ejected and connection through the connector 317 is disrupted.

Figure 4:
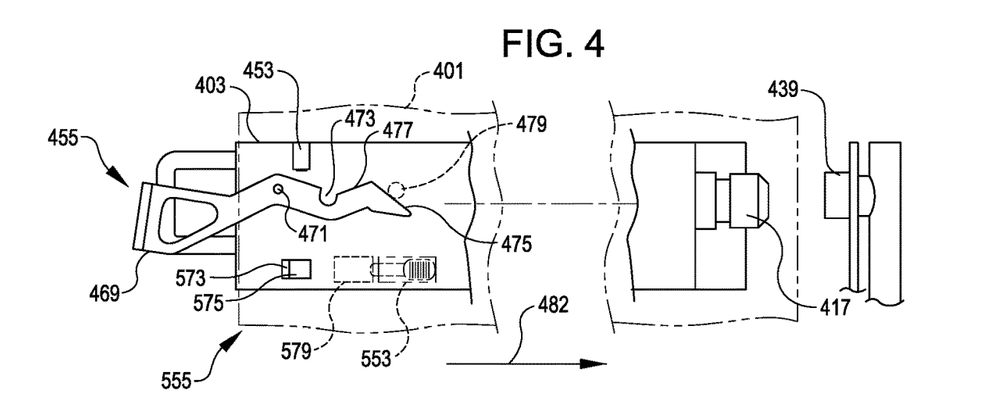
FIG. 4 is a side view showing a chassis partially received within a rack according to certain embodiments.

FIG. 4 depicts a side view of a chassis 403. The chassis 403 may be inserted relative to a rack 401. Elements in FIG. 4 may correspond to elements similar names discussed earlier herein. The chassis 403 in installation may be aligned so that a connector 417 of the chassis is aligned with a mating connector 439 included in, supported by, or otherwise associated with the rack 401.

The chassis 403 can include or be associated with a latch 455. The latch 455 in FIG. 4 includes a handle 469, a pivot 471, a notch 473, a first ramped surface 475, and a second ramped surface 477. A pin 479 is also shown in FIG. 4, for example, supported by the rack 401. The pin 479 can be positioned to come into contact with the latch 455 in the process of sliding the chassis 403 into the rack 401. A releaser 453 may be provided (e.g., on the chassis 403) in a position capable of reaching the latch 455 to disengage the latch 455. Other latching structures can additionally or alternatively be used in conjunction with or in lieu of the latch 455. For example, a secondary latch 555 is also shown in FIG. 4. The secondary latch 555 includes a button 573, e.g., which may be suitably spring-loaded or otherwise appropriately biased to be able to pop into or through an opening 579 in the rack 401 to secure the chassis 403 relative to the rack 401. A secondary releaser 553 may also be provided (e.g., on the rack 401) in a position capable of reaching the secondary latch 555 to disengage the secondary latch 555, such as by engaging a ramped surface 575 on the button 573. Alternatively, in some examples, the secondary releaser 553 may correspond to an actuator or other structure within the chassis 403 and capable of retracting the button 573 toward the interior of the chassis 403.

In operation, the chassis 403 may be inserted into the rack 401, for example, moved toward the right in FIG. 4. Inserting the chassis 403 into the rack 401 can cause the latch 455 to come into contact with the pin 479. For example, the first ramped surface 475 may contact the pin 479 in response to insertion of the chassis 403 into the rack 401. Continued movement of the chassis 403 into the rack (e.g., as depicted by arrow 482) may cause the first ramped surface 475 to move along the pin 479. Moving the first ramped surface 475 along the pin 479 may cause the latch 455 to rotate about the pivot 471. Pivoting of the latch 455 as the chassis 403 is inserted may cause relative travel of the pin 479 along the latch 455, for example, to the position shown in FIG. 5. Moreover, moving the chassis 403 into the rack 401 may cause the button 573 to be pushed behind a portion of the rack 401, e.g., in response to the ramped surface 575 on the button coming into contact with an edge or other projecting surface of the rack 401.

Figure 5:
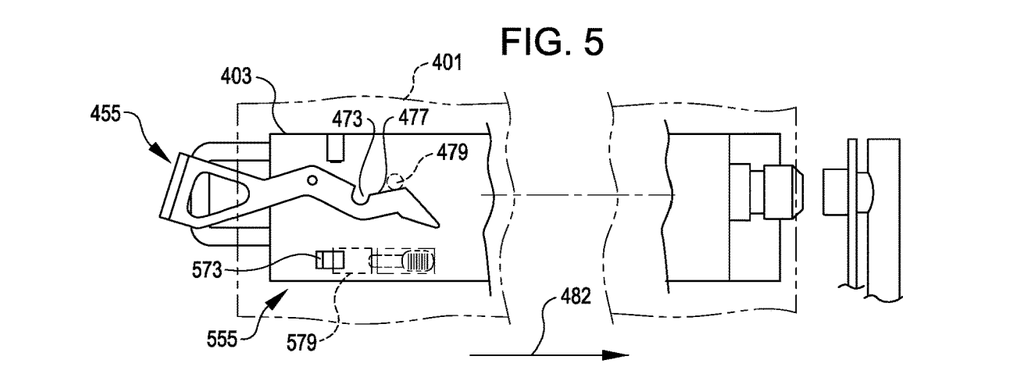
FIG. 5 is a side view of the components of FIG. 4 with the chassis translated further into the rack than in FIG. 4 according to certain embodiments.
Figure 6:
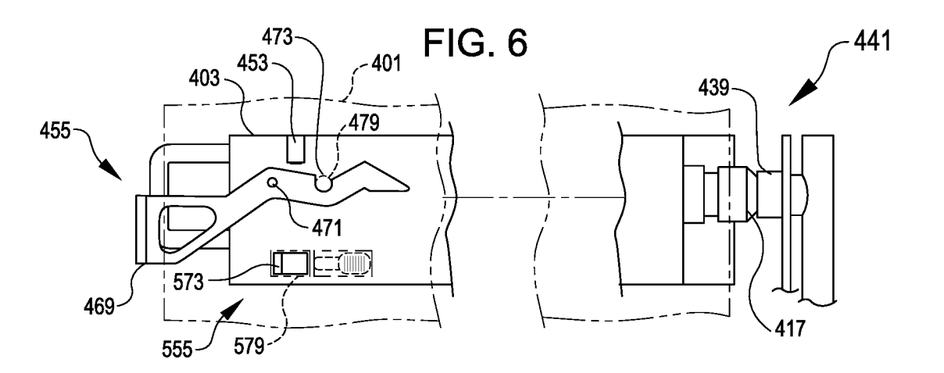
FIG. 6 shows a side view of the components of FIGS. 4 and 5 with the chassis in a seated position according to certain embodiments.

In FIG. 5, the pin 479 is contacting the second ramped surface 477 of the latch 455. The second ramped surface 477 (e.g., like the first ramped surface 475) may cause the latch 455 to travel along the pin 479 in a manner that guides the notch 473 of the latch 455 toward the pin 479. Continued movement of inserting the chassis 403 into the rack 401 (e.g., as depicted by arrow 482 in FIG. 5), may cause additional relative movement of the pin 479 toward the notch 473 and may result, for example, in reaching a state such as shown in FIG. 6. Moreover, continued movement of inserting the chassis 403 into the rack 401 (e.g., as depicted by arrow 482 in FIG. 5), may cause the button 573 to move closer to the opening 579, for example, ultimately resulting in the button 573 reaching a state such as shown in FIG. 6.

In FIG. 6, the pin 479 is received within the notch 473. For example, the latch 455 may rotate around the pivot 471 in response to the latch 455 traveling along the pin 479. In some embodiments, the weight of the handle 469 or other portion of the latch 455 on a trailing end of the latch 455 may bias the handle 469 into engagement of the notch 473 with the pin 479 on the rack 401. FIG. 6 also shows the button 573 received within the opening 579. For example, when the button 573 has been moved into alignment with the opening 579, a force from the button 573 being spring-loaded or otherwise biased may cause the button 573 to be pushed into the opening 579 (e.g., represented by the outline of the button 573 being slightly larger in FIG. 6 than in FIG. 5, corresponding to the button 573 having moved in the out-of-the-page direction). Respective components may be positioned such that the latch 455 will secure relative to the pin 479 (and/or the button 573 of the secondary latch 555 will engage the opening 579) at a location in which the connector 417 of the chassis 403 is engaged with a mating connector 439 of the rack 401. For example, the latch 455 and/or secondary latch 555 may maintain the chassis 403 in a position in which the connector 417 and mating connector 459 are engaged, for example, to permit flow into the chassis 403 of coolant, and/or connection for power and/or data transfer. The latch 455 and/or secondary latch 555 may maintain the chassis 403 in a seated position and in opposition to a biasing force, e.g., which may be provided by a biaser 343 (not separately shown in FIG. 6 for purposes of not obscuring the drawing, although potentially present within and/or adjacent the connector interface 441 formed by the connector 417 and the mating connector 439).

Figure 7:
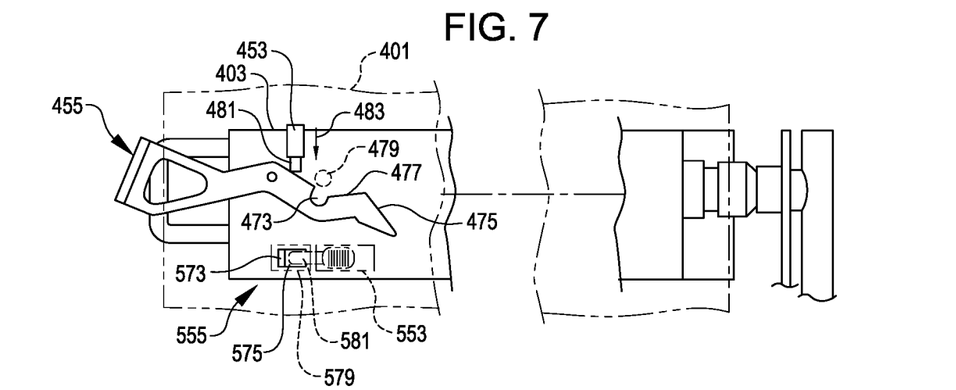
FIG. 7 depicts the components of FIGS. 4 through 6 with a latch disengaged according to certain embodiments.

Referring to FIG. 7, the releaser 453 may function to release the latch 455. For example, in FIG. 7, an extension 481 is shown projecting from the releaser 453. For example, this may correspond to a solenoid or other suitable actuator. The extension 481 is shown extended out, for example, as illustrated by arrow 483. The releaser 453 may engage the latch 455 and push the latch 455 so that the notch 473 is out of engagement with the pin 479. In some examples, the releaser 453 may additionally or alternative include an electromagnet or other structure capable of imparting force through provision of a magnetic field to move and release the latch 455. Also referring to FIG. 7, the secondary releaser 553 may function to release the secondary latch 555. For example, a secondary extension 581 may extend from the secondary releaser 553 (e.g., via a solenoid or other suitable actuator) and engage the ramped surface 575 or other surface of the button 573 to push the button 573 out of engagement with the opening 579 (e.g., represented by the outline of the button 573 being slightly smaller in FIG. 7 than in FIG. 6, corresponding to the button 573 having moved in the into-the-page direction). In some examples, other structures may be used for the secondary releaser 553, including, but not limited to an electromagnet or other structure capable of magnetically moving the button 573 out of the opening 579 and/or a structure that pulls the button 573 from within the chassis 403.

Figure 8:
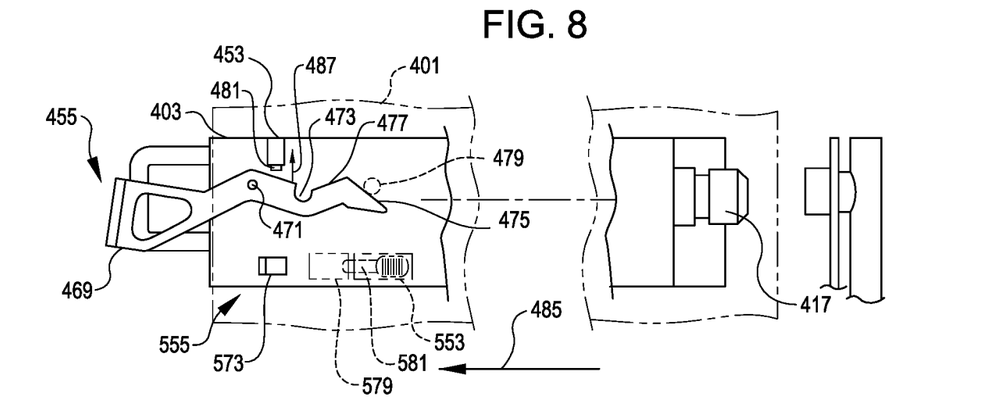
FIG. 8 depicts the components of FIGS. 4 through 7 with the chassis in an ejected position according to certain embodiments.

Referring to FIG. 8, releasing the latch 455 and/or the secondary latch 555 may allow the chassis 403 to move relative to the rack 401. For example, as illustrated by arrow 485, the biasing force of the biaser 343 (e.g., which may include either or both of the first biaser 143 or the second biaser 145) may move the chassis 403. Movement of the chassis 403 in a direction out of the rack 401 may allow the latch 455 to rotate about the pivot 471 and allow the pin 479 to be traveled along by the second ramped surface 477 and/or the first ramped surface 475. Additionally or alternatively, movement of the chassis 403 in a direction out of the rack 401 may move the button 573 away from the opening 579. In some examples, the spring-loaded or otherwise biased nature of the button 573 may cause the button 573 to press against an inside of the rack 401 and provide frictional engagement that may affect a distance the chassis 403 will travel relative to the rack 401 in response to ejection.

The releaser 453 may retract the extension 481, for example, as illustrated by arrow 487. Retracting the extension 481 or otherwise resetting the releaser 453 may allow the releaser 453 to be suitably positioned out of a position of interfering with the latch 455. For example, retracting the extension 481 may position the releaser 453 out of a path of travel of the latch 455. Positioning the releaser 453 out of a path of travel of the latch 455 may avoid obstructing the movement of the chassis 403 and facilitate movement of the chassis 403 out of the rack 401 (e.g., as depicted in FIG. 8) and/or into the rack 401 (e.g., as may occur in a subsequent insertion of the chassis 403 into the rack 401 as in FIG. 4). In a similar manner, the secondary releaser 553 may retract the secondary extension 581 or otherwise reset in a manner that may allow the secondary releaser 553 to be out of a position of interfering with the secondary latch 555.

In various embodiments, the releaser 453 may be positioned to avoid interfering with manual actuation of the latch 455. For example, referring back to FIG. 6, the releaser 453 when not activated (e.g., with the extension 481 retracted) may be positioned so that the handle 469 can be operated manually without being blocked by the releaser 453. For example, in the depicted arrangement, a user may push or pull the handle 469 upward to cause rotation and action similar to that depicted in FIGS. 6-8 without actuation of the releaser 453. In a similar manner, the positioning or arrangement of the secondary releaser 553 may allow manual actuation for ejection, such as by a user pushing the button 573 (in the direction into the page in FIG. 8). Allowing manual activation via the latch 455 and/or the secondary latch 555 may allow a user to release the chassis 403, for example, in case of emergency or other situation where the releaser 453 and/or secondary releaser 553 may be inoperable or impractical to operate.

Other variations are possible. For example, elements are not limited to the relative placement depicted in the figures. As one example, although in FIG. 3 the chassis 303 is diagrammatically depicted as containing or bearing components such as the sensor 319, the controller 351, the releaser 353, the latch 355, the connector 317, and the biaser 343, one or more of these components could additionally or alternatively be borne by the rack 101 or other structure or otherwise include at least some portion remote from the chassis 303. As a further example, although FIG. 4 shows the latch 455 and button 573 borne by the chassis 403 and the pin 479 and opening 579 borne by the rack 401, positioning may be opposite or otherwise different, such as in an arrangement in which the latch 455 and/or button 573 is mounted on the rack 401 and the pin 479 and/or opening 579 is provided on the chassis 403. Similarly, in some embodiments, the releaser 453 and/or the secondary releaser 553 in FIG. 4 could alternatively be mounted on the rack 401 instead of the chassis 403.

Figure 9:
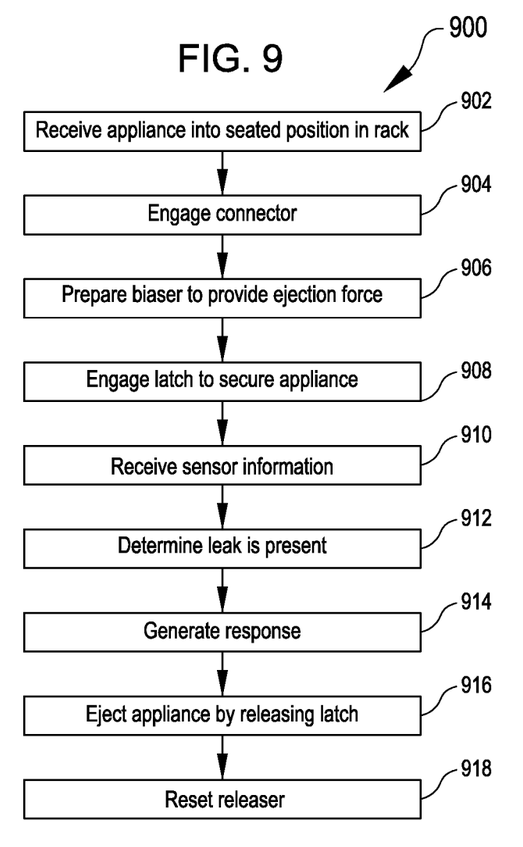
FIG. 9 is a flowchart illustrating an example process that may be performed relative to an ejection system according to certain embodiments.

FIG. 9 is a flowchart illustrating an example process 900 that may be performed, for example, relative to an ejection system 305 according to certain embodiments. For example, some actions may be performed by the appliance 309, chassis 303, rack 101, controller 351, or other elements of the ejection system 305. Some or all of the process 900 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The process 900 at 902 can include receiving an appliance into a seated position in a rack. This may correspond to an appliance 309 (e.g., in a chassis 303) and/or a rack 101. The action at 902 may have several effects, which may include those described by way of example below at other actions in the process 900.

The process 900 at 904 can include engaging a connector. For example, engaging a connector may couple a coolant conduit 111 of an appliance 309 and/or chassis 103 with a coolant supply line 147. Engaging the connector at 904 additionally or alternatively may include establishing a connection for power and/or data transfer, such as via the data connection interface 133 and/or the power connection interface 127. The connector may become engaged as a result of or response to the appliance 309 and/or the chassis 303 being received in the seated position in the rack at 902.

The process 900 at 906 can include preparing a biaser to provide an ejection force. This may occur in response to receiving the appliance 309 and/or the chassis 303 into the seated position at 902. The action at 906 may involve pre-loading or otherwise preparing a biaser 343 to provide a force for moving the appliance 309 and/or the chassis 303 away from the seated position. For example, the action at 906 may correspond to compressing structure of either or both of the first biaser 143 or the second biaser 145 in response to loading the appliance 309 and/or the chassis 103 into the rack 101. The action at 906 may include preparing the biaser 343 to provide a force sufficient to disconnect various different connectors 317, such as to simultaneously disconnect the power connector 113, data connector 115, and coolant connector 117. In some embodiments, the biaser 343 may be tuned to provide a force that will cause the appliance 309 and/or the chassis 303 to move a predetermined distance. For example, the predetermined distance may be selected so that the appliance 309 and/or the chassis 303 will remain in the rack 101 after moving from the seated position to the ejected position. Causing the appliance 309 and/or the chassis 303 to remain in the rack 101 or otherwise travel a predetermined distance may allow an ejected appliance 309 and/or chassis 303 to be readily visually identified and/or reduce a chance of the appliance 309 and/or the chassis 303 falling to the floor, extending an amount that would pose a hazard to a passerby, or otherwise protruding in a deleterious manner.

The process 900 at 908 can include engaging a latch to secure the appliance and/or the chassis. Engaging the latch 355 may secure the appliance 309 and/or the chassis 303 in the seated position. The latch 355 may secure the appliance 309 and/or the chassis 303 in response to the appliance 309 and/or the chassis 303 being received in the seated position in the rack at 902.

The process at 910 can include receiving information from a sensor. For example, the information may be moisture information from a sensor 319. The information may additionally or alternatively be pressure information or other information that may be used to register a change indicative of a coolant leak. The sensor 319 may be associated with the appliance 309 and/or the chassis 303. For example, the sensor 319 may be within the appliance 309 and/or the chassis 303 or within a sufficient proximity to be able to detect conditions within the appliance 309 and/or the chassis 303.

The process 900 at 912 can include determining that a leak is present. For example, this may correspond to making a determination (e.g., by the response module 367) based on the sensor data (e.g., which may be obtained by the detection module 365). The determination that a leak is present may be based on a threshold reading being exceeded. For example, the determination may involve registering that a leak is present if a certain level (e.g., voltage, pressure, flow rate, amount of bubbles) is detected above a minimum threshold by the sensor 319. In some aspects, the determination may include that the sensor information has exceeded a threshold reading for a threshold duration of time. For example, in some embodiments, the response module 367 may register a leak as present only if a particular level or higher has been maintained for a certain amount of time or longer.

The process 900 at 914 can include generating a response. The action at 914 may be performed by the response module 367. In some embodiments, the response may include generating release instructions to cause a releaser 353 to release the latch 355 to permit the biaser 343 to move the appliance 309 and/or the chassis 303 toward an ejected position. In some embodiments, moving the appliance 309 and/or the chassis 103 toward the ejected position may cause the coolant conduit 111 to be disconnected from the coolant supply line 147. Ejecting the appliance 309 and/or the chassis 103 additionally or alternatively may disconnect the power connector 113 and/or data connector 115 and disrupt connection of data and/or power.

In some embodiments, the action at 914 includes generating release instructions that avoid causing a second releaser to release a second latch of a second appliance and/or chassis where a leak has not been detected. For example, this may allow an appliance 309 and/or chassis 303 where a leak has not been detected to continue in operation while another appliance 309 and/or chassis 303 where a leak has been detected is removed from operation by ejection. In some embodiments, the action at 914 may include generating data transfer instructions that cause data to be moved or copied from an appliance 309 in advance of the release of the latch 355 caused by the release instructions. In some embodiments, the action at 914 may include generating power instructions that cause an appliance 309 to shut down or change a power state in advance of the release of the latch 355 caused by the releasing instructions.

At 916, the process 900 can include ejecting the appliance and/or the chassis, e.g., based on the response generated at 914. For example, this may correspond to the response module 367 controlling the releaser 353 to release the latch 355 (e.g., by extending the extension 481 and/or the secondary extension 581) so that the biaser 343 can move the appliance 309 and/or the chassis 303 for ejection.

At 918, the process may include generating reset instructions for the releaser. For example, the reset instructions may cause the releaser 353 to return to a primed state to avoid interference with moving the appliance 309 and/or the chassis 303 back to the seated position from the ejected position. As an illustrative example, the releaser 453 may retract the extension 481 and/or the secondary releaser 553 may retract the secondary extension 581 in response to the reset instructions.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
   a rack;
   a chassis slidingly received in the rack;
   a datacenter computing equipment component borne by the chassis;
   a cooling system comprising:
      a coolant supply line coupled with the rack;
      a conduit arranged in the chassis to convey coolant for cooling the datacenter computing equipment component; and
      a connector releasably connecting the conduit with the coolant supply line; and
   an ejection system comprising:
      a biaser biasing the chassis toward an ejected position in which the connector is disconnected so that the conduit is disconnected from the coolant supply line;
      a latch securing, against the bias of the biaser, the chassis in a seated position in which the connector connects the conduit with the coolant supply line;
      a sensor positioned to detect a leak in the cooling system occurring at or near the datacenter computing equipment component; and a releaser comprising an actuator that releases the latch in response to leak detection by the sensor to permit the biaser to move the chassis toward the ejected position.

2. The system of claim 1, further comprising:
a power connector arranged to supply power to the datacenter computing equipment component in the seated position and to disconnect in response to the biaser moving the chassis toward the ejected position; and
a data connector arranged to supply data to or from the datacenter computing equipment component in the seated position and to disconnect in response to the biaser moving the chassis toward the ejected position.

3. The system of claim 1, wherein the connector comprises the biaser.

4. The system of claim 1, wherein the latch is coupled with a handle accessible from outside of the chassis for manual actuation to release the latch.

5. A system, comprising:
an electronic appliance slidably positionable within a rack between a seated position, in which a coolant supply line of the rack is coupled with a conduit of the electronic appliance for conveying coolant past the electronic appliance, and an ejected position, in which the conduit is disconnected from the coolant supply line;
a sensor that detects a coolant leak at or near the electronic appliance when the electronic appliance is positioned in the seated position;
a biaser configured to bias the electronic appliance toward the ejected position;
a latch configured to secure the electronic appliance in the seated position against the bias of the biaser; and
a releaser configured to release the latch in response to coolant leak detection by the sensor to permit the biaser to move the electronic appliance toward the ejected position.

6. The system of claim 5, wherein the biaser comprises:
a first biaser incorporated into a connector configured to releasably connect the coolant supply line of the rack with the conduit of the electronic appliance; and
a second biaser distinct from the connector.

7. The system of claim 5, wherein the latch comprises a pivotable lever having a notch sized to receive a pin.

8. The system of claim 7, wherein the lever comprises a ramped surface that guides the pin into the notch in response to the electronic appliance sliding into the rack.

9. The system of claim 5, wherein the latch comprises a button sized to engage an opening and biased toward insertion into the opening.

10. The system of claim 5, wherein the releaser comprises a solenoid, electromagnet, or other actuator.

11. The system of claim 5, further comprising a data connector of the electronic appliance and a power connector of the electronic appliance, wherein the biaser is configured to provide a biasing force sufficient to:
disconnect the data connector from engagement with a mating data connector of the rack;
disconnect the power connector from engagement with a mating power connector of the rack; and
disconnect the conduit from engagement with the coolant supply line.

12. The system of claim 5, wherein the biaser is tuned to provide a force that will cause the electronic appliance to remain in the rack after moving from the seated position to the ejected position.

13. The system of claim 5, wherein the electronic appliance comprises a datacenter computing equipment component, and wherein the system further comprises:
the rack;
a chassis in which the electronic appliance is positioned;
the datacenter computing equipment component; and
a cooling system comprising:
the coolant supply line;
the conduit; and
a connector releasably connecting the conduit with the coolant supply line.

14. A method comprising:
detecting a coolant leak at or near an electronic appliance that is slidably received in a rack in a seated position in which a coolant supply line of the rack is coupled with a conduit of the electronic appliance for conveying coolant past the electronic appliance; and
in response to detecting the coolant leak, generating release instructions to cause a releaser to release a latch to permit a biaser to move the electronic appliance toward an ejected position in which the conduit is disconnected from the coolant supply line.

15. The method of claim 14, further comprising generating re-set instructions to cause the releaser to return to a primed state to avoid interference with moving the electronic appliance back to the seated position from the ejected position.

16. The method of claim 14, wherein the detecting the coolant leak comprises determining that information from a sensor aimed at detecting a leak relative to the electronic appliance has exceeded a threshold reading or exceeded a threshold reading for a threshold duration of time.

17. The method of claim 14, further comprising retaining a second electronic appliance, in which the coolant leak has not been detected, in a second seated position in the rack.

18. The method of claim 14, further comprising copying data from the electronic appliance before the electronic appliance is moved toward the ejected position.

19. The method of claim 14, further comprising causing the electronic appliance to shut down or change a power state before the electronic appliance is moved toward the ejected position.

20. The method of claim 14, further comprising:
receiving the electronic appliance into the seated position in the rack;
engaging a connector to couple the conduit with the coolant supply line in response to the receiving the electronic appliance into the seated position in the rack;
preparing, in response to the receiving the electronic appliance into the seated position in the rack, the biaser to provide a force for moving the electronic appliance away from the seated position; and
engaging the latch to releasably secure the electronic appliance in the seated position in response to the receiving the electronic appliance into the seated position in the rack.

\* \* \* \* \*